(12) United States Patent
Derat et al.

(10) Patent No.: US 11,137,424 B2
(45) Date of Patent: Oct. 5, 2021

(54) SYSTEM AND METHOD FOR PARALLEL MEASUREMENT OF DEVICES UNDER TEST IN AN OPEN OVER THE AIR ENVIRONMENT

(71) Applicant: Rohde & Schwarz GmbH & Co. KG, Munich (DE)

(72) Inventors: Benoit Derat, Munich (DE); Corbett Rowell, Munich (DE); Sherif Ahmed, Starnberg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 3 days.

(21) Appl. No.: 16/694,672

(22) Filed: Nov. 25, 2019

(65) Prior Publication Data

US 2021/0080490 A1 Mar. 18, 2021

(30) Foreign Application Priority Data

Sep. 17, 2019 (EP) ..................................... 19197656

(51) Int. Cl.
*G01R 17/20* (2006.01)
*G01R 1/04* (2006.01)

(52) U.S. Cl.
CPC ............... *G01R 17/20* (2013.01); *G01R 1/04* (2013.01)

(58) Field of Classification Search
None
See application file for complete search history.

(56) References Cited

U.S. PATENT DOCUMENTS 9,179,340 B2 11/2015 Foegelle
2019/0107567 A1* 4/2019 Morgan ................ G01R 29/10

OTHER PUBLICATIONS

"Compensated Compact Test Range", published in University of Applied Sciences Munich, Laboratory for Satellite Communications, retrieved on Oct. 11, 2019, from https://www.compactrange.de/index.php/testi-facility/detailed-description, 15 pages.
Fordham et al., "An Introduction to Antenna Test Ranges, Measurements and Instrumentation", published in Antenna Systems and Technology, 1999, 13 pages.

\* cited by examiner

*Primary Examiner* — Jas A Sanghera
(74) *Attorney, Agent, or Firm* — Ditthavong, Steiner & Mlotkowski

(57) ABSTRACT

A system for parallel measurement of devices under test in an open over the air environment is provided. The system comprises a plurality of alignment structures, each comprising a shaped reflector arranged at a top end of the alignment structure and an antenna arranged at the focal region of the shaped reflector. In this context, the devices under test are arranged at bottom ends of the plurality of alignment structures, opposite to a respective shaped reflector. In addition, the plurality of alignment structures are placed parallel to each other without shielded enclosures.

15 Claims, 5 Drawing Sheets

SYSTEM AND METHOD FOR PARALLEL MEASUREMENT OF DEVICES UNDER TEST IN AN OPEN OVER THE AIR ENVIRONMENT

PRIORITY

This application claims priority of the European patent application EP 19 197 656.2 filed on Sep. 17, 2019, which is incorporated by reference herewith.

FIELD OF THE INVENTION

The invention relates to parallel measurement of devices under test (DUTs) in an open environment, especially for production line testing of multiple DUTs with limited interferences.

BACKGROUND OF THE INVENTION

Generally, over the air (OTA) testing is performed in a shielded and encapsulated environment, inside of an anechoic chamber. These chambers are designed to be non-reflective and echo free. The size of the chamber varies with the object and frequency ranges being tested, and it is normally lined with foam pyramids that absorb reflected signals. The testing takes into account the radiation characteristics on the equipment while eliminating interference from any other transmissions. In wireless device production testing, these chambers are required to be opened and closed for subsequent positioning of the device under test (DUT). Alternatively, these chambers are loaded with the DUT using complex mechanisms, for example a six-axis robot. Consequently, the overall time and cost is increased significantly, especially in the case of production testing.

From the foregoing perspective, an open test environment is beneficial for production testing. However, without the shielding of the chamber, the relative interferences on the test setups certainly degrade the overall test accuracy. Furthermore, in order to test multiple devices (DUTs) simultaneously, especially in an OTA environment, separate anechoic environments are commonly implemented for each DUT for maintaining an acceptable level of interference. For example, the document U.S. Pat. No. 9,179,340 B2 shows a system for OTA testing of wireless devices. The system comprises separated chambers configured to contain the devices to be tested, where the chambers are connected by separately bounded propagation path corridors. However, the system results in a more complex anechoic chamber with several separate enclosures inside in order to isolate the devices.

Accordingly, a need of the invention is to provide a system and a method for parallel measurement of DUTs for OTA production testing in a simplified and cost-effective manner with minimum level of interference.

SUMMARY OF THE INVENTION

According to a first aspect of the invention, a system for parallel measurement of devices under test in an open over the air environment is provided. The system comprises a plurality of alignment structures, each comprising a shaped reflector arranged at a top end of the alignment structure and an antenna arranged at the focal region of the shaped reflector. In this context, the devices under test are arranged at bottom ends of the plurality of alignment structures, opposite to a respective shaped reflector. In addition, the plurality of alignment structures are placed parallel to each other without shielded enclosures.

Therefore, multiple compact antenna test range (CATR) setups are utilized in order to measure corresponding DUTs without any shielded enclosure. Due to the natural property of CATR, the reflectors will mostly scatter away an incoming interference from the quiet zone, particularly for the radiation from a neighboring DUT. As a consequence, the reflectors and beam collimation mechanisms are providing natural interference blocking capabilities from radiations directing from a neighboring test setup. Advantageously, multiple DUTs can be tested in parallel with limited interferences without the necessity of separate shielded enclosures. This is particularly advantageous for production testing of wireless devices, for instance in fifth generation (5G) production lines.

According to a first preferred implementation form of said first aspect of the invention, the system further comprises a measuring unit, preferably connected to the antenna of each alignment structures. Advantageously, the parallel measurement of the DUTs is performed in a simplifier manner.

According to a second preferred implementation form of said first aspect of the invention, the measuring unit is adapted to measure a similar performance characteristic for each alignment structures. Additionally or alternatively, the measuring unit is adapted to measure different performance characteristics for each alignment structures. Hence, a higher measurement flexibility is achieved.

According to a further preferred implementation form of said first aspect of the invention, the devices under test are placed on a production line, preferably on a conveyor belt at the bottom ends of the plurality of alignment structures. In this context, the DUTs can be placed on a single conveyor belt situated at the bottom ends of the alignment structures. Alternatively, multiple parallel conveyor belts can be arranged at the bottom ends of respective alignment structures.

According to a further preferred implementation form of said first aspect of the invention, each device under test is operative as a directive antenna with a main beam within a solid angle of 120 degrees. Advantageously, the DUTs are directed with main radiation power in a solid angle of 120 by 120 degrees around the reflector so as to reduce interference towards a neighboring test setup.

According to a further preferred implementation form of said first aspect of the invention, the measuring unit is adapted to perform measurements simultaneously on the devices under test operating with the main beam within the solid angle of 120 degrees. Advantageously, parallel testing of the DUTs is performed simultaneously.

According to a further preferred implementation form of said first aspect of the invention, the plurality of alignment structures are arranged horizontally and/or vertically and/or in a sloping position with respect to a test plane. Hence, the system allows flexible test setup with regard to, for instance the type of DUTs to be tested, the alignment requirements for the production line, the arrangement of the test facility and so on.

According to a further preferred implementation form of said first aspect of the invention, the plurality of alignment structures are arranged in a close proximity, preferably with a separation distance of less than 2 meters. Advantageously, the DUTs are measured in a compact environment.

According to a further preferred implementation form of said first aspect of the invention, the system further comprises a positioner adapted to synchronize the orientation of the plurality of alignment structures. Hence, the CATRs and the DUTs are advantageously oriented with respect to each other.

According to a further preferred implementation form of said first aspect of the invention, the system further comprises shielding walls arranged in-between the plurality of alignment structures, and whereby the measuring unit is adapted to perform measurements simultaneously on the devices under test operating with the main beam with solid angle greater than 120 degrees. Advantageously, the DUTs can be measured with limited interferences even if the DUTs are not perfectly oriented and/or beamforming.

According to a second aspect of the invention, a method is provided for parallel measurement of devices under test in an open over the air environment in a system comprising a plurality of alignment structures. The method comprises the step of arranging a shaped reflector at a top end of the alignment structure. In addition, the method comprises the step of arranging an antenna at the focal region of the shaped reflector. Moreover, the method comprises the step of arranging the devices under test at bottom ends of the plurality of alignment structures, opposite to a respective shaped reflector. In this context, the plurality of alignment structures are placed parallel to each other without shielded enclosures. Therefore, multiple compact antenna test range (CATR) setups are utilized in order to measure corresponding DUTs without any shielded enclosure.

According to a first preferred implementation form of said second aspect of the invention, the method further comprises the step of measuring a similar performance characteristic for each alignment structures. In addition to this or as an alternative, the method further comprises the step of measuring different performance characteristics for each alignment structures. Advantageously, a higher measurement flexibility is realized.

According to a second preferred implementation form of said second aspect of the invention, the method further comprises the step of placing the devices under test on a production line, preferably on a conveyor belt at the bottom ends of the plurality of alignment structures. In this context, the DUTs can be placed on a single conveyor belt situated at the bottom ends of the alignment structures. Alternatively, multiple parallel conveyor belts can be arranged at the bottom ends of respective alignment structures.

According to a further preferred implementation form of said second aspect of the invention, the method further comprises the step of operating each device under test as a directive antenna with a main beam within a solid angle of 120 degrees. Advantageously, the DUTs are directed with main radiation power in a solid angle of 120 by 120 degrees around the reflector so as to reduce interference towards a neighboring test setup.

According to a further preferred implementation form of said second aspect of the invention, the method further comprises the step of performing simultaneous measurements on the devices under test operating with the main beam within the solid angle of 120 degrees. Advantageously, parallel testing of the DUTs is performed simultaneously.

BRIEF DESCRIPTION OF THE DRAWINGS

Exemplary embodiments of the invention are now further explained with respect to the drawings by way of example only, and not for limitation. In the drawings.

Reference will now be made in detail to the embodiments of the present invention, examples of which are illustrated in the accompanying drawings. However, the following embodiments of the present invention may be variously modified and the range of the present invention is not limited by the following embodiments.

DETAILED DESCRIPTION OF PREFERRED EMBODIMENTS

Figure 1:
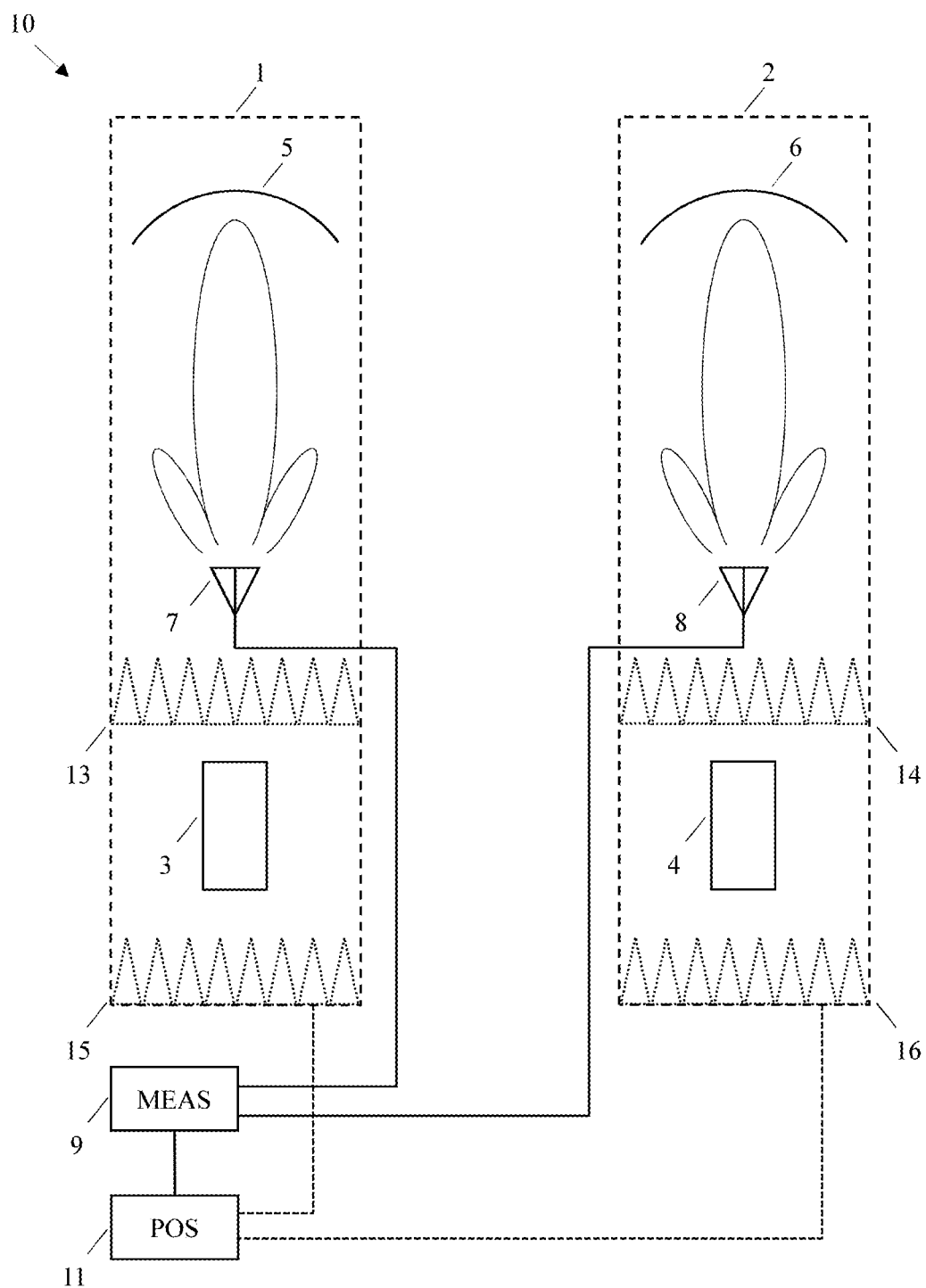
FIG. 1 shows a first exemplary embodiment of the system according to the first aspect of the invention.

In FIG. 1, a first exemplary embodiment of the system 10 according to the first aspect of the invention is illustrated. In particular, two parallel alignment structures 1, 2 are illustrated herein each comprising a reflector 5, 6 and an antenna 7, 8, for instance a feed antenna, which is arranged at the focal region of the reflector 5, 6. The reflectors 5, 6 are situated at the top ends of the alignment structures 1, 2 while the DUTs 3, 4 are placed at the bottom ends so that the reflectors 5, 6 are hanging above the respective DUTs 3, 4. The DUTs 3, 4 are wireless devices, for instance modular devices, antenna arrays and the like, preferably operative according to 5G communication standards. The alignment structures 1, 2 resemble vertical CATR systems where the CATRs and the DUTs 3, 4 are oriented so that the parallel DUTs 3, 4 do not radiate energy directly towards each other.

The system further comprises a measuring unit 9, connected to each antenna 7, 8 and performs measurement on the DUTs 3, 4 simultaneously. Each of the antennas 7, 8 are connected to the measuring unit 9 via switching means, for instance via radio frequency (RF) switch boxes (not shown), either individually or collectively. Hence, the measuring unit 9 is able to measure the same performance characteristic (e.g., Error Vector Magnitude) for the DUTs 3, 4. Additionally, the measuring unit 9 is able to measure a plurality of different performance characteristics (e.g., Error Vector Magnitude and Channel Power) for the DUTs 3, 4. The measuring unit 9 may additionally include measuring antennas or probes or sensors in order to perform detailed measurement on the DUTs 3, 4. Generally, the measuring unit 9 comprises signal generating means, data/signal processing means, user interfaces and storage means, which are well-known in the art and are not described in detail to avoid unnecessarily obscuring the invention.

The system further comprises a positioner 11 connected to the measuring unit 9 and further to the alignment structures 1, 2 in order to synchronize their respective orientation. The positioner 11 may optionally connected to the DUTs 3, 4 in order to synchronize their orientation with respect to the alignment structures 1, 2. In this context, the positioner 11 may orient the alignment structures 1, 2 vertically or horizontally or in a sloping angle with respect to a test plane. In addition, the positioner 11 may orient the alignment structures 1, 2 at different angles with respect to each other. The alignment structures 1, 2 can be oriented externally by the positioner 11, for instance by a user via the measuring unit 9 as per the requirements of production testing.

Particularly for the alignment structures 1, 2 illustrated herein, the two DUTs 3, 4 to be tested in parallel can be placed on a production line. Hence, the two alignment structures 1, 2 are vertically oriented above the production line with two DUTs 3, 4 on a conveyor belt or two parallel conveyor belts, which are beneath the respective reflectors 5, 6. At each instance of the two DUTs 3, 4, measurements are performed in parallel with the two corresponding alignment structures 1, 2. It is advantageous that no shielding enclosure (e.g., anechoic chambers) is required in order to achieve production level testing of multiple devices. However, the alignment structures 1, 2 may comprise some level of shielding 13, 14 and 15, 16 as illustrated herein, for instance to isolate the back-lobes from the antennas 7, 8 and side-lobes of the DUTs 3, 4. The antennas 7, 8 illuminate the respective reflectors 5, 6 from the focal region and the DUTs 3, 4 (e.g., antenna arrays) are operative with main radiation power in a solid angle of 120 by 120 degree around the respective reflectors 5, 6. It is to be noted that the example shielding 13, 14 and 15, 16 are partially shown in FIG. 1. Additional shielding in between the antennas 7, 8 and the respective reflectors 5, 6 may be introduced as required.

The two alignment structures 1, 2 can be placed, for instance at a close proximity of 1 or 2 meters, preferably less than 2 meters in order to achieve a compact test environment. As the main radiation from the DUTs 3, 4 is directed in a 120 by 120 solid angle around the reflectors 5, 6 (+/−60 degrees from boresight in two orthogonal directions), the radiation from one DUT will negligibly affect the neighboring DUT in direct line of sight. For instance, the radiation from DUT 3 will negligibly affect the DUT 4 in direct line of sight. On the other hand, the electromagnetic waves radiated by the DUT 3 could actually reach the reflector 6 with non-negligible power. However, the reflector 6 will mostly scatter away from the quiet zone, where the DUT 4 is, the radiation incoming from DUT 3, as DUT 3 is not placed at the focal region of the reflector 6. Consequently, the reflectors 5, 6 and beam collimation mechanisms provide natural interference blocking capabilities from radiation coming from a neighboring test setup.

It is important to note that the number of alignment structures as well as the number of DUTs and their respective orientation are illustrated herein by way of example only, and not for limitation.

Figure 2:
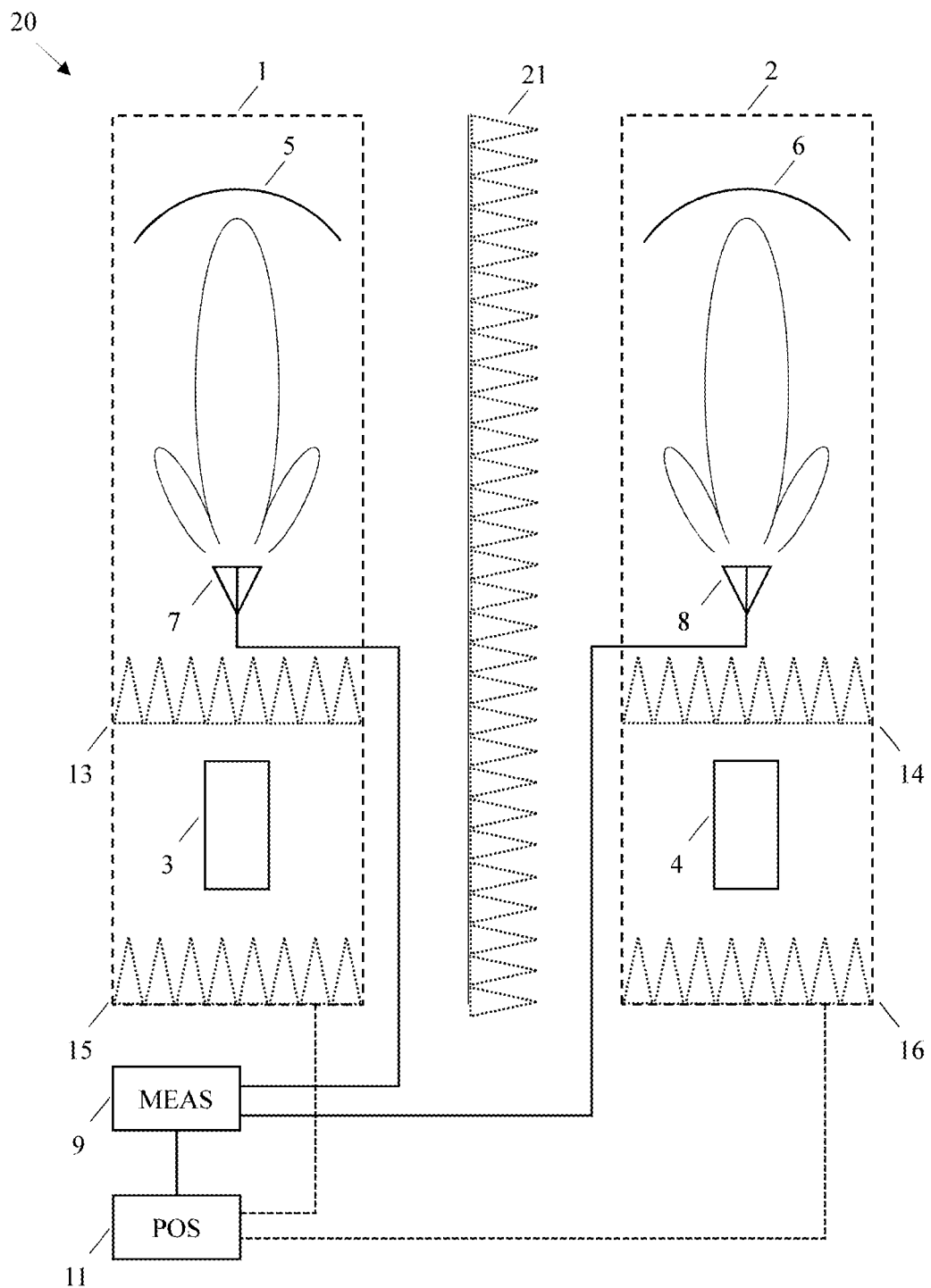
FIG. 2 shows a second exemplary embodiment of the system according to the first aspect of the invention.

In FIG. 2, a second exemplary embodiment of the system 20 according to the first aspect of the invention is illustrated. The system 20 differs from the system 10 of FIG. 1 in that it comprises additional shielding walls 21 or a single shielding wall in between the alignment structures 1, 2 in order to minimize the interferences. The shielding walls 21 can be a form of surfaces with metallic skin, segments with RF absorbing materials (e.g., Ferrite tiles or pyramidal foam) or any combination thereof. Such shielding walls 21 advantageously suppress the neighboring interferences, particularly in the case when a DUT (e.g., DUT 3) radiates beams with solid angle greater than 120 degrees that would interfere with the neighboring DUT (e.g., DUT 4) as well as with the DUT next to the neighboring DUT 4. Hence, it is possible to test multiple devices on a production line even if one or more devices may radiate waves with main beam solid angle greater than 120 degrees.

Figure 3:
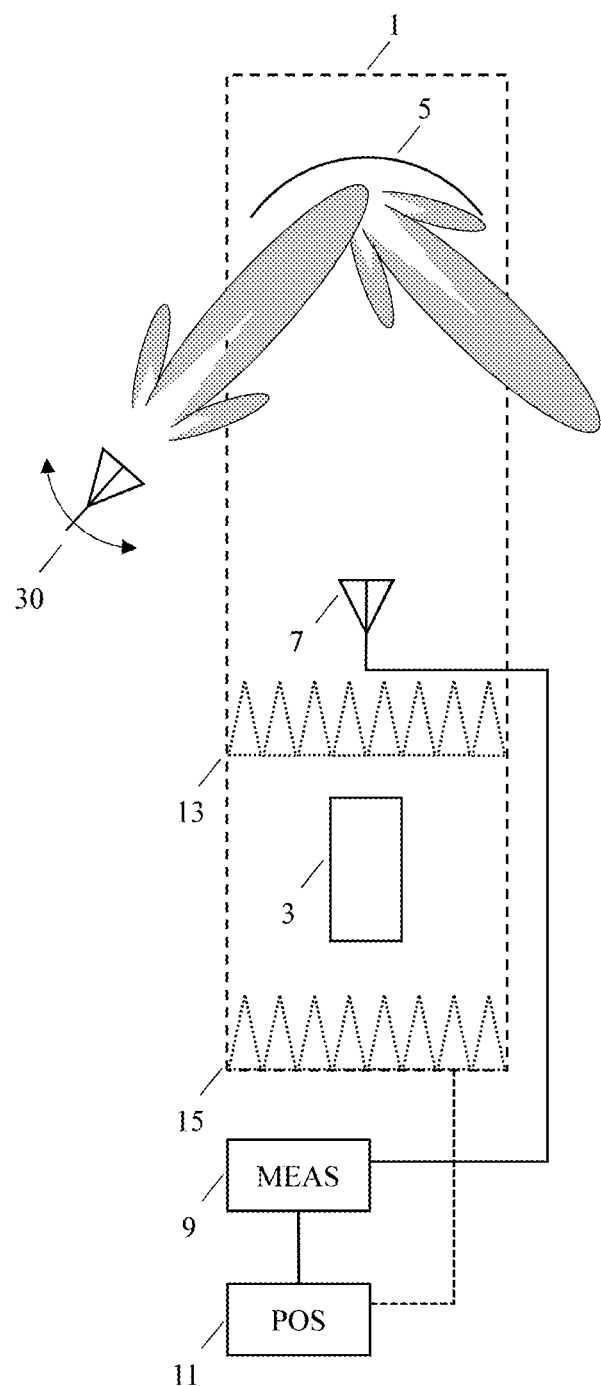
FIG. 3 shows an exemplary interference situation on a reflector of an alignment structure according to the first aspect of the invention.

In FIG. 3, an exemplary interference situation on a reflector 5 of an alignment structure 1 according to the first aspect of the invention is illustrated. The interference source 30 can be, for instance a neighboring DUT. Although the interference source 30 would negligibly affect the DUT 3 in direct line of sight, the interference level on the reflector 5 is at considerable intensity. However, the reflector 5 will almost scatter away the interference from the quiet zone since the interference source 30 is not originating from the focal region of the reflector 5. As a consequence, interferences on the reflector 5 can be adequately minimized even without a shielded enclosure.

Figure 4:
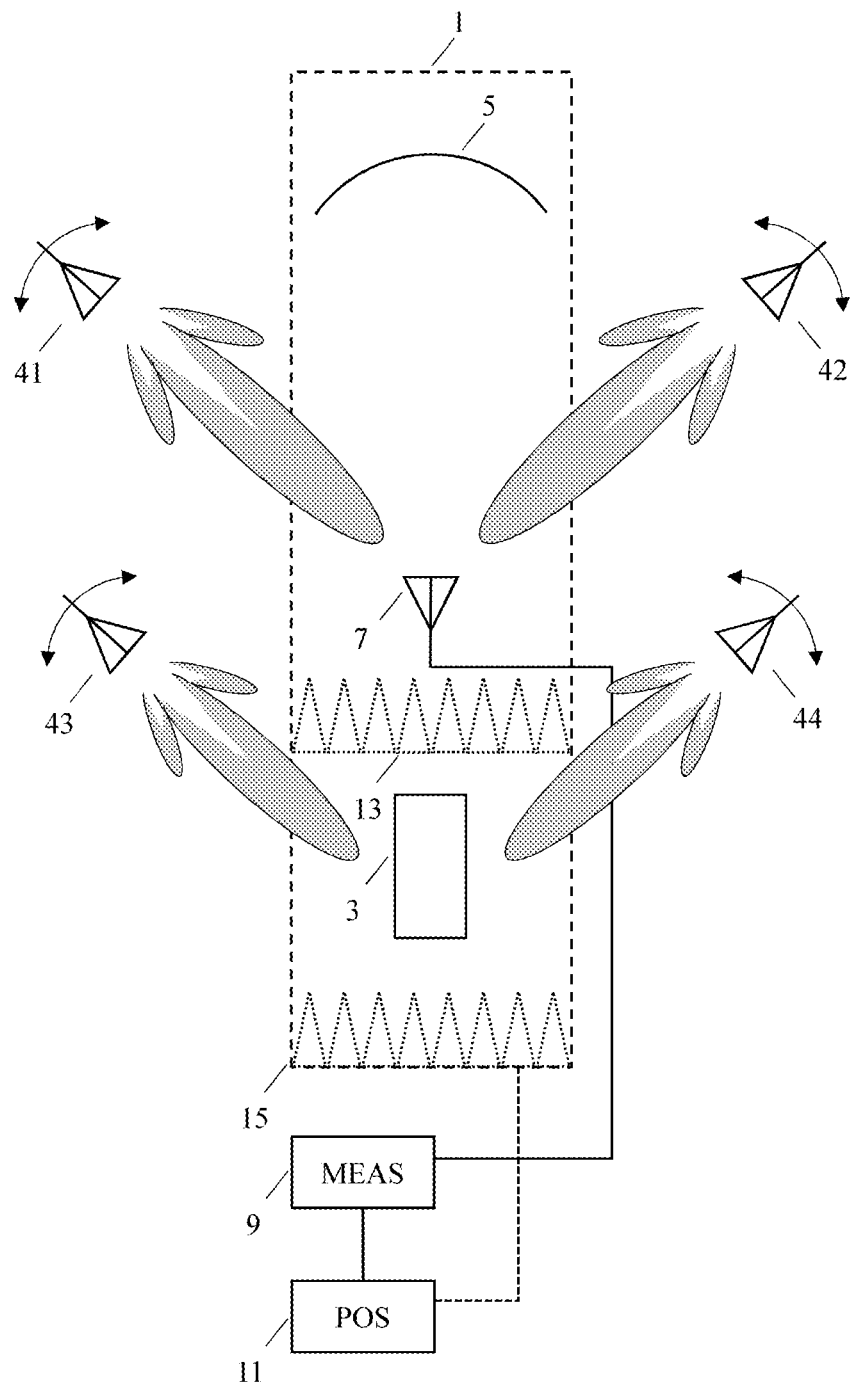
FIG. 4 shows an exemplary interference situation on the antennas of an alignment structure according to the first aspect of the invention.

In FIG. 4, an exemplary interference situation on the antennas 3, 7 of an alignment structure 1 according to the first aspect of the invention is illustrated. The interference sources 41, 42 can be the scattering waves from neighboring reflectors and the interference sources 43, 44 can be one or more of the neighboring antennas. Alternatively, the interference sources 41, 42, 43, 44 can be any sort of scattering coming from one or more neighboring reflectors, antennas and DUTs. However, due to beam collimation on the reflectors and the concentrated beam radiation within a solid angle of 120 degrees, most of the interference sources 41, 42, 43, 44 cause interference with a negligible power level and therefore would not affect the antenna 7 as well as the DUT 3 significantly.

Figure 5:
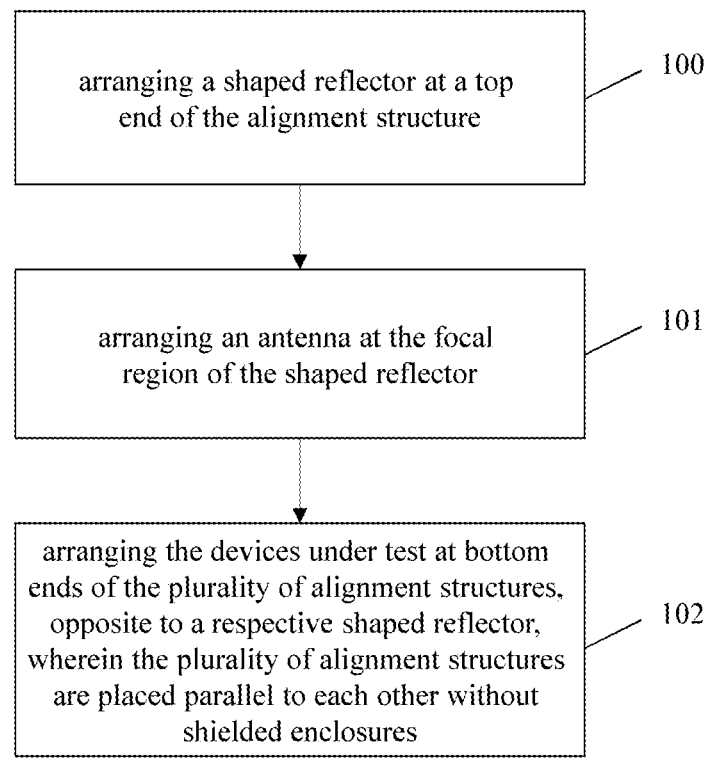
FIG. 5 shows an exemplary embodiment of the method according to the second aspect of the invention.

In FIG. 5, an exemplary embodiment of the method according to the second aspect of the invention is illustrated. In a first step 100, a shaped reflector 5, 6 is arranged at a top end of the alignment structure 1, 2. In a second step 101, an antenna 7, 8 is arranged at the focal region of the shaped reflector 5, 6. In a third step 102, the devices under test 3, 4 are arranged at bottom ends of the plurality of alignment structures 1, 2, opposite to a respective shaped reflector 5, 6. In this context, the plurality of alignment structures 1, 2 are placed parallel to each other without shielded enclosures.

Moreover, the method further comprises the step of measuring a similar performance characteristic for each alignment structures 1, 2. Additionally or alternatively, the method further comprises the step of measuring a different performance characteristic for each alignment structures 1, 2.

It is particularly advantageous if the method further comprises the step of placing the devices under test 3, 4 on a production line, preferably on a conveyor belt at the bottom ends of the plurality of alignment structures 1, 2.

In addition, the method further comprises the step of operating each device under test 3, 4 as a directive antenna with a main beam within a solid angle of 120 degrees.

Moreover, the method further comprises the step of performing simultaneous measurements on the devices under test 3, 4 operating with the main beam within the solid angle of 120 degrees.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed:

1. A system for parallel measurement of devices under test in an open over the air environment comprises a plurality of alignment structures, each comprising:
    a shaped reflector arranged at a top end of each alignment structure, and
    an antenna arranged at a focal region of the shaped reflector;
    wherein the devices under test are arranged at bottom ends of the plurality of alignment
    structures, opposite to a respective shaped reflector, and
    wherein the alignment structures are placed parallel to each other without shielded enclosures.

2. The system according to claim 1,
    wherein the system further comprises a measuring unit connected to the antenna of each of the alignment structures.

3. The system according to claim 2,
    wherein the measuring unit is adapted to measure a performance characteristic for each of the alignment structures, and/or
    wherein the measuring unit is adapted to measure different performance characteristics for each of the alignment structures.

4. The system according to claim 1,
    wherein the devices under test are placed on a conveyor belt at the bottom ends of the plurality of alignment structures.

5. The system according to claim 1,
    wherein each device under test is operative as a directive antenna with a main beam within a solid angle of 120 degrees.

6. The system according to claim 5,
    wherein the measuring unit is adapted to perform measurements simultaneously on the devices under test operating with the main beam within the solid angle of 120 degrees.

7. The system according to claim 5,
    wherein the system further comprises shielding walls arranged in-between the plurality of alignment structures, and whereby the measuring unit is adapted to perform measurements simultaneously on the devices under test operating with the main beam with the solid angle greater than 120 degrees.

8. The system according to claim 1,
    wherein the plurality of alignment structures is arranged horizontally with respect to a test plane, and/or
    wherein the plurality of alignment structures is arranged vertically with respect to the test plane, and/or
    wherein the plurality of alignment structures is arranged in a sloping position with respect to the test plane.

9. The system according to claim 1,
    wherein the plurality of alignment structures is arranged with a separation distance of less than 2 meters.

10. The system according to claim 1,
    wherein the system further comprises a positioner adapted to synchronize orientation of the plurality of alignment structures.

11. A method for parallel measurement of devices under test in an open over the air environment, in a system comprising a plurality of alignment structures, comprises the steps of:
    arranging a shaped reflector at a top end of each alignment structure,
    arranging an antenna at a focal region of the shaped reflector,
    arranging the devices under test at bottom ends of the plurality of alignment structures, opposite to a respective shaped reflector, and
    wherein the plurality of alignment structures are placed parallel to each other without shielded enclosures.

12. The method according to claim 11,
    wherein the method further comprises the step of measuring a performance characteristic for each alignment structures, and/or
    wherein the method further comprises the step of measuring different performance characteristics for each of the alignment structures.

13. The method according to claim 11,
    wherein the method further comprises the step of placing the devices under test on a conveyor belt at the bottom ends of the plurality of alignment structures.

14. The method according to claim 11,
    wherein the method further comprises the step of operating each device under test as a directive antenna with a main beam within a solid angle of 120 degrees.

15. The method according to claim 14,
    wherein the method further comprises the step of performing simultaneous measurements on the devices under test operating with the main beam within the solid angle of 120 degrees.

* * * * *